United States Patent
Kamikawa et al.

(10) Patent No.: US 8,268,087 B2
(45) Date of Patent: Sep. 18, 2012

(54) LIQUID PROCESSING APPARATUS, LIQUID PROCESSING METHOD, AND STORAGE MEDIUM

(75) Inventors: Yuji Kamikawa, Tosu (JP); Norihiro Ito, Koshi (JP); Jiro Higashijima, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 356 days.

(21) Appl. No.: 12/596,882

(22) PCT Filed: Dec. 12, 2008

(86) PCT No.: PCT/JP2008/072626
§ 371 (c)(1),
(2), (4) Date: Oct. 21, 2009

(87) PCT Pub. No.: WO2009/084406
PCT Pub. Date: Jul. 9, 2009

(65) Prior Publication Data
US 2010/0083986 A1    Apr. 8, 2010

(30) Foreign Application Priority Data

Dec. 27, 2007  (JP) ................................ 2007-337053
Aug. 6, 2008   (JP) ................................ 2008-203391

(51) Int. Cl.
B08B 7/00   (2006.01)
B08B 7/04   (2006.01)
B08B 3/00   (2006.01)

(52) U.S. Cl. .............. 134/33; 134/26; 134/34; 134/133; 134/147; 134/153; 134/902

(58) Field of Classification Search .................... 134/18, 134/26, 32, 33, 34, 56 R, 57 R, 58 R, 66, 134/133, 134, 137, 140, 147, 153, 902; 156/345.55
See application file for complete search history.

(56) References Cited

U.S. PATENT DOCUMENTS

| | | | |
|---|---|---|---|
| 5,868,865 A | 2/1999 | Akimoto | |
| 6,672,779 B2 * | 1/2004 | Ueda et al. | 396/604 |
| 6,742,279 B2 * | 6/2004 | Lubomirsky et al. | 34/317 |

(Continued)

FOREIGN PATENT DOCUMENTS

JP          09-290197 A1    11/1997

(Continued)

OTHER PUBLICATIONS

Japanese Office Action dated Oct. 7, 2011 (with English Translation).

(Continued)

*Primary Examiner* — Alexander Markoff
(74) *Attorney, Agent, or Firm* — Burr & Brown (57) ABSTRACT

A liquid processing apparatus includes: a hollow holding plate configured to hold an object to be processed; a hollow outer rotational shaft fixedly connected to the holding plate; a rotary drive part configured to rotate the outer rotational shaft; and a lift pin plate disposed in a hollow space of the holding plate, and having a lift pin configured to support the object to be processed. Inside the lift pin plate, a cleaning-liquid supply part configured to supply a cleaning liquid is extended. Connected to the lift pin plate is a lifting member configured to locate the lift pin plate on an upper position and a lower position. When located on the lower position, the lift pin plate receives a force of the rotary drive part for rotating the outer rotational shaft so that the lift pin plate is rotated.

13 Claims, 8 Drawing Sheets

U.S. PATENT DOCUMENTS

| | | |
|---|---|---|
| 6,752,877 B2 | 6/2004 | Ono et al. |
| 6,792,959 B2 | 9/2004 | Ono et al. |
| 6,848,455 B1 * | 2/2005 | Shrinivasan et al. ........... 134/1.3 |
| 2007/0000527 A1 * | 1/2007 | Aegerter et al. .............. 134/149 |
| 2007/0240824 A1 * | 10/2007 | Kaneko et al. ........... 156/345.11 |

FOREIGN PATENT DOCUMENTS

| | | |
|---|---|---|
| JP | 2003-068700 A1 | 3/2003 |
| TW | 300177 B | 3/1997 |
| TW | 421827 B | 2/2001 |
| TW | 515002 B | 12/2002 |

OTHER PUBLICATIONS

TW Office Action dated Apr. 10, 2012 (with English translation).

* cited by examiner

LIQUID PROCESSING APPARATUS, LIQUID PROCESSING METHOD, AND STORAGE MEDIUM

CROSS REFERENCE TO RELATED APPLICATIONS

This application is based upon and claims the benefit of priority from the prior Japanese Patent Application No. 2007-337053 filed on Dec. 27, 2007 and the prior Japanese Patent Application No. 2008-203391 filed on Aug. 6, 2008, the entire contents of which are incorporated herein by reference.

FIELD OF THE INVENTION

The present invention relates to a liquid processing apparatus and a liquid processing method in which a cleaning liquid is supplied to an object to be processed that is rotated so as to clean the object to be processed, and to a storage medium configured to implement the liquid processing method.

BACKGROUND ART

As described in JP9-290197A, there has been conventionally known a liquid processing apparatus including: a hollow bottom plate configured to hold an object to be processed such as a semiconductor wafer (hereinafter referred to also as "wafer"); a rotational shaft fixedly connected to the bottom plate, the rotational shaft being configured to be rotated by a spin motor; a supply duct configured to supply a cleaning liquid to a wafer held by the bottom plate; and a substrate lift pin capable of being raised so as to support the wafer from below.

In the conventional liquid processing apparatus, there is a possibility that cleaning liquids, such as a chemical liquid and a rinse liquid used for cleaning a wafer, might adhere to the substrate lift pin via a through hole. Thus, after drying a wafer, when the wafer is raised by the substrate lift pin and is delivered to a transfer robot, liquid droplets of the cleaning liquid adhering to the substrate lift pin may adhere to a rear surface of the wafer.

When the cleaning liquid adheres to the wafer, watermarks are formed on the wafer itself to which the liquid droplets adhere. In addition thereto, watermarks are generated on other wafers contained in a carrier into which the wafer has been brought, because of an increase in humidity in the carrier.

DISCLOSURE OF THE INVENTION

The present invention has been made in view of the above circumstances. The object of the present invention is to provide a liquid processing apparatus and a liquid processing method that can prevent a cleaning liquid from remaining on a member for lifting up a substrate, to thereby prevent adhesion of the cleaning liquid to a rear surface of the substrate, whereby formation of watermarks on the object to be processed can be prevented, and a storage medium configured to implement the liquid processing method.

A liquid processing apparatus according to the present invention comprises a hollow holding plate configured to hold an object to be processed;

a hollow outer rotational shaft fixedly connected to the holding plate;

a rotary drive part configured to rotate the outer rotational shaft in a predetermined rotational direction;

a lift pin plate disposed in a hollow space of the holding plate, and having a lift pin configured to support the object to be processed;

a cleaning-liquid supply part disposed inside the holding plate, the cleaning-liquid supply part being configured to supply a cleaning liquid to the object to be processed held by the holding plate; and a lifting member configured to raise and lower the lift pin plate so as to locate the lift pin plate on an upper position and a lower position;

wherein, when the lift pin plate is located on the lower position, the lift pin plate is rotated by receiving a force imparted from the rotary drive part for rotating the outer rotational shaft.

Due to this structure, the cleaning liquid can be prevented from pooling in the lift pin plate, and the cleaning liquid can be prevented from remaining on the lift pin. Thus, adhesion of the cleaning liquid on a rear surface of the object to be processed can be prevented.

In the liquid processing apparatus according to the present invention, it is preferable that the liquid processing apparatus further comprises an inner rotational shaft extending in a hollow space of the outer rotational shaft and fixedly connected to the lift pin plate, wherein the inner rotational shaft is located on the upper position and the lower position by the lifting member, and when the inner rotational shaft is located on the lower position, the inner rotational shaft is capable of being in contact with the outer rotational shaft in the rotational direction of the outer rotational shaft.

In the liquid processing apparatus according to the present invention, it is preferable that the inner rotational shaft has an inside projection part projecting outwardly from a margin of the inner rotational shaft;

the outer rotational shaft has an outside recess part adapted to receive the inside projection part; and the inside projection part received in the outside recess part is capable of being in contact with the outer rotational shaft in the rotational direction of the outer rotational shaft.

In the liquid processing apparatus according to the present invention, it is preferable that the outer rotational shaft has an outside projection part projecting inwardly from a margin of the outer rotational shaft;

the inner rotational shaft has an inside recess part adapted to receive the outside projection part; and the outside projection part received in the inside recess part is capable of being in contact with the inner rotational shaft in the rotational direction of the outer rotational shaft.

In the liquid processing apparatus according to the present invention, it is preferable that when the lift pin plate is located on the lower position, the lift pin plate is capable of being fixed with respect to the holding plate.

In the liquid processing apparatus according to the present invention, it is preferable that a first magnet is disposed in the lift pin plate;

a second magnet is disposed in the holding plate; and when the lift pin plate is located on the lower position, the first magnet is fixed with respect to the second magnet, so that the lift pin plate is capable of being fixed with respect to the holding plate.

In the liquid processing apparatus according to the present invention, it is preferable that a first magnet is disposed in an inner rotational shaft;

a second magnet is disposed in the outer rotational shaft at a position opposed to the first magnet; and when the lift pin plate is located on the lower position, the first magnet is fixed with respect to the second magnet in a non-contact manner.

In the liquid processing apparatus according to the present invention, it is preferable that at least a part of an inner rotational shaft has a metal part made of a metal;

there is provided a magnet configured to impart a magnetic force to the metal part so as to draw the inner rotational shaft downward; and when the lift pin plate is located on the lower position, the lift pin plate is capable of being fixed with respect to the holding plate in the rotational direction of the outer rotational shaft by an own weight of the lift pin plate and the magnetic force imparted to the metal part.

In the aforementioned liquid processing apparatus, it is preferable that the magnet is an electromagnet Due to this structure, when the lift pin plate is separated from the holding plate, an accidental movement of the lift pin plate can be prevented.

In the liquid processing apparatus according to the present invention, it is preferable that a sealing member is disposed between the lift pin plate and the holding plate.

Due to this structure, the cleaning liquid can be prevented from entering the hollow space of the outer rotational shaft from between the lift pin plate and the holding plate.

In the liquid processing apparatus according to the present invention, it is preferable that, when the lift pin plate is located on the lower position, a distance between a distal end of the lift pin of the lift pin plate and a lower end of the object to be processed held by the holding plate is 5 mm or smaller.

Due to this structure, the end of the lift pin can be cleaned by the cleaning liquid flowing along the lower surface of the object to be processed. Thus, when the distal end of the lift pin is brought into contact with the rear surface of the object to be processed, contaminations adhering to the distal end of the lift pin 21 can be prevented from moving onto the rear surface of the object to be processed.

In the liquid processing apparatus according to the present invention, it is preferable that the lift pin of the lift pin plate is located on a position near to a periphery of the holding plate.

Due to this structure, after the rear surface of the object to be processed has been cleaned, the distal end of the lift pin can be cleaned. Thus, when the distal end of the lift pin is brought into contact with the rear surface of the object to be processed, contaminations adhering to the distal end of the lift pin can be more reliably prevented from moving onto the rear surface of the object to be processed.

A liquid processing method according to the present invention is performed with the use of a liquid processing apparatus including: a hollow holding plate; a hollow outer rotational shaft fixedly connected to the holding plate; a rotary drive part configured to rotate the outer rotational shaft in a predetermined rotational direction; a lift pin plate disposed in a hollow space of the holding plate and having a lift pin; a cleaning-liquid supply part disposed inside the holding plate; and a lifting member configured to raise and lower the lift pin plate so as to locate the lift pin plate on an upper position and a lower position; the liquid processing method comprising the steps of:

an upper-position locating in which the lift pin plate is located on the upper position by the lifting member;

a supporting in which an object to be processed is supported by the lift pin of the lift pin plate;

a lower-position locating in which the lift pin plate is located on the lower position by the lifting member;

a holding in which the object to be processed is held by the holding plate;

a rotating in which the outer rotational shaft is rotated by the rotary drive part, so that the object to be processed held by the holding plate is rotated;

a chemical-liquid supplying in which a chemical liquid is supplied to the object to be processed by the cleaning-liquid supply part; and a rinsing in which a rinse liquid is supplied to the object to be processed by the cleaning-liquid supply part;

wherein the lift pin plate located on the lower position is rotated by a force imparted from the rotary drive part for rotating the outer rotational shaft.

Due to this method, the cleaning liquid can be prevented from pooling in the lift pin plate, and the cleaning liquid can be prevented from remaining on the lift pin. Thus, adhesion of the cleaning liquid on a rear surface of the object to be processed can be prevented.

A storage medium according to the present invention stores a computer program for causing a computer to implement a liquid processing method, the liquid processing method performed with the use of a liquid processing apparatus including: a hollow holding plate; a hollow outer rotational shaft fixedly connected to the holding plate; a rotary drive part configured to rotate the outer rotational shaft in a predetermined rotational direction; a lift pin plate disposed in a hollow space of the holding plate and having a lift pin; a cleaning-liquid supply part disposed inside the, holding plate; and a lifting member configured to raise and lower the lift pin plate so as to locate the lift pin plate on an upper position and a lower position; the liquid processing method comprising the steps of:

an upper-position locating in which the lift pin plate is located on the upper position by the lifting member;

a supporting in which an object to be processed is supported by the lift pin of the lift pin plate;

a lower-position locating in which the lift pin plate is located on the lower position by the lifting member;

a holding in which the object to be processed is held by the holding plate;

a rotating in which the outer rotational shaft is rotated by the rotary drive part, so that the object to be processed held by the holding plate is rotated;

a chemical-liquid supplying in which a chemical liquid is supplied to the object to be processed by the cleaning-liquid supply part; and a rinsing in which a rinse liquid is supplied to the object to be processed by the cleaning-liquid supply part;

wherein the lift pin plate located on the lower position is rotated by a force imparted from the rotary drive part for rotating the outer rotational shaft.

Due to this structure, the cleaning liquid can be prevented from pooling in the lift pin plate, and the cleaning liquid can be prevented from remaining on the lift pin. Thus, adhesion of the cleaning liquid on a rear surface of the object to be processed can be prevented.

According to the present invention, since the lift pin plate is rotated by receiving the force imparted from the rotary drive part for rotating the outer rotational shaft, the cleaning liquid can be prevented from pooling in the lift pin plate, and the cleaning liquid can be prevented from remaining on the lift pin. Thus, adhesion of the cleaning liquid on a rear surface of the object to be processed can be prevented. Accordingly, formation of watermarks on the object to be processed can be prevented.

MODES FOR CARRYING OUT THE INVENTION

First Embodiment

Figure 1:
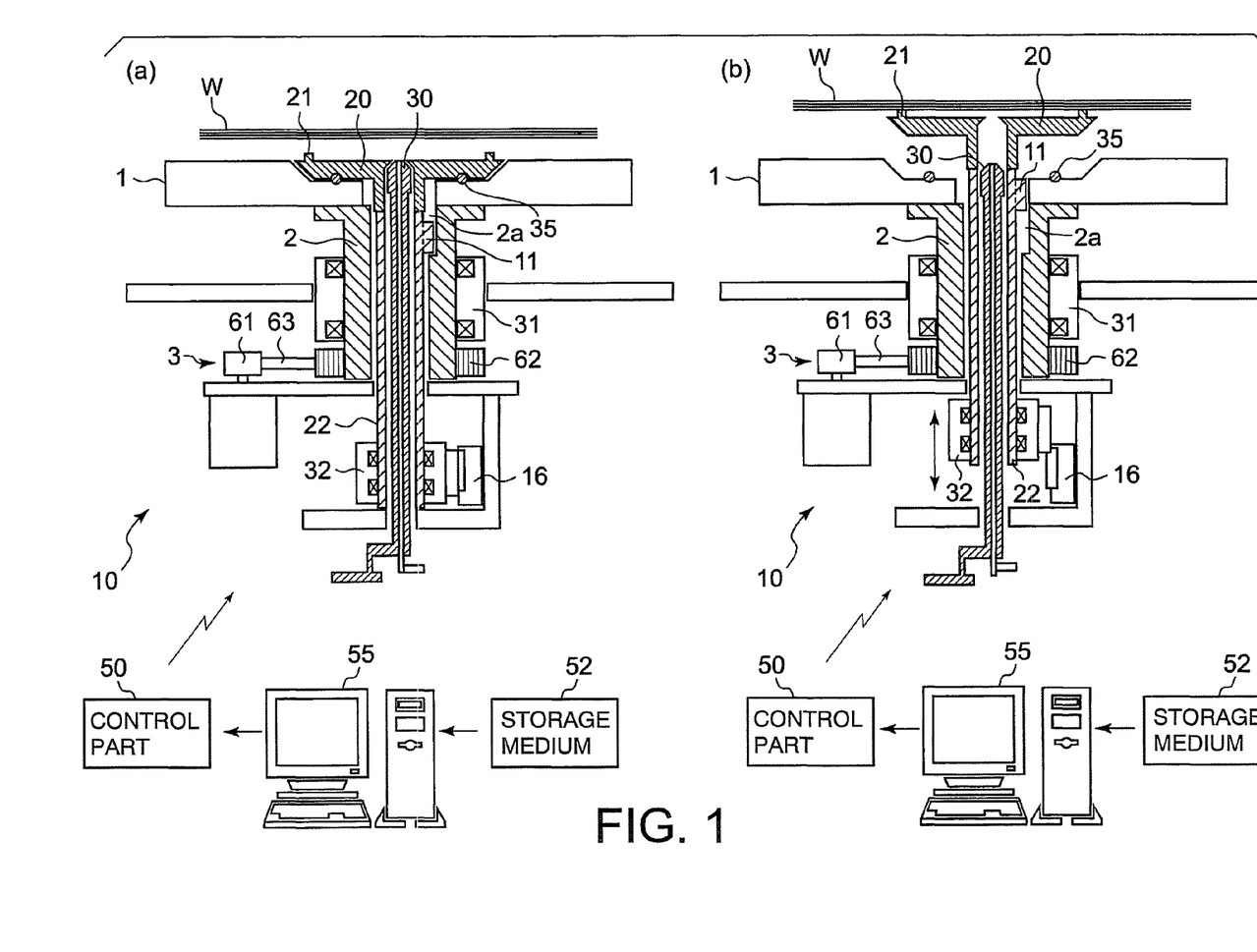
FIG. 1 is lateral sectional views showing a driving manner of a liquid processing apparatus in a first embodiment of the present invention.
Figure 4:
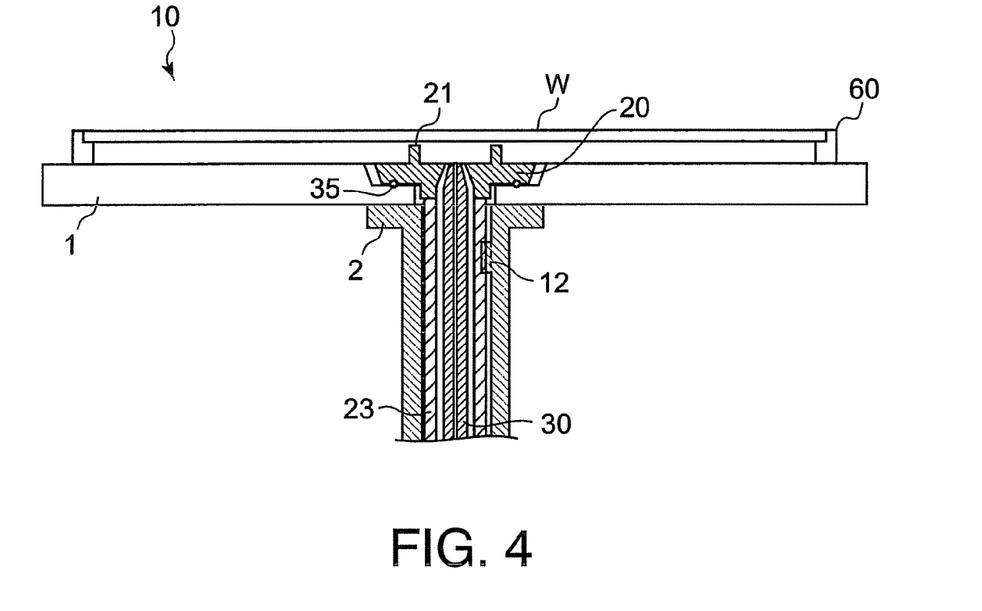
FIG. 4 is a lateral sectional view showing the liquid processing apparatus in another embodiment of the first embodiment of the present invention.
Figure 5:
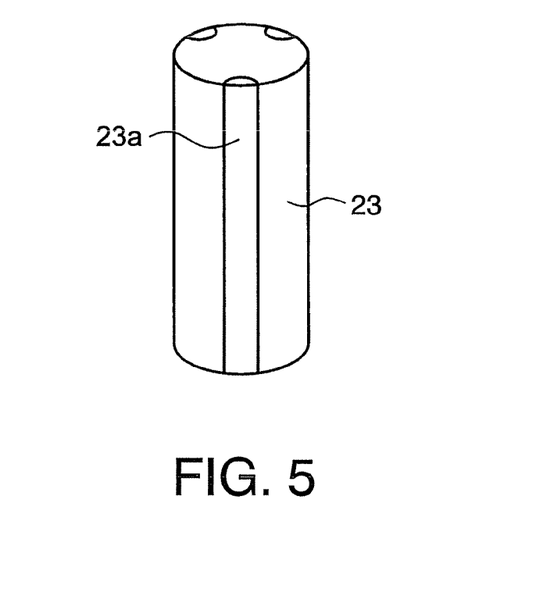
FIG. 5 is a perspective view of an inner rotational shaft used in the liquid processing apparatus in another embodiment of the first embodiment of the present invention.
Figure 6:
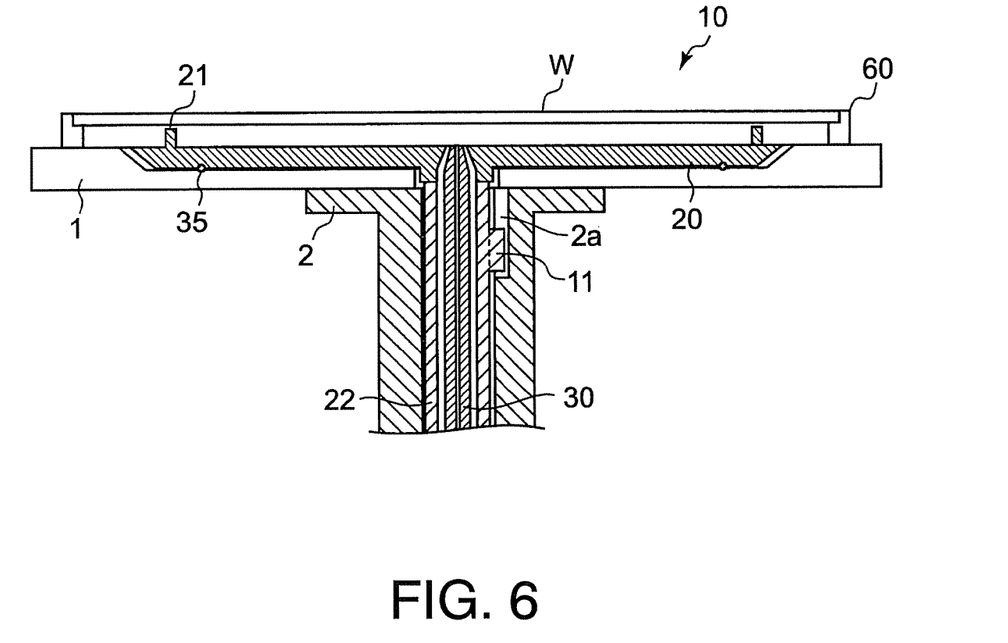
FIG. 6 is a lateral sectional view showing the liquid processing apparatus in still another embodiment of the first embodiment of the present invention.

A first embodiment of the liquid processing apparatus and the liquid processing method according to the present invention are described herebelow with reference to the drawings. FIGS. 1(a) (b) to FIG. 6 are the views showing the first embodiment of the present invention.

Figure 2:
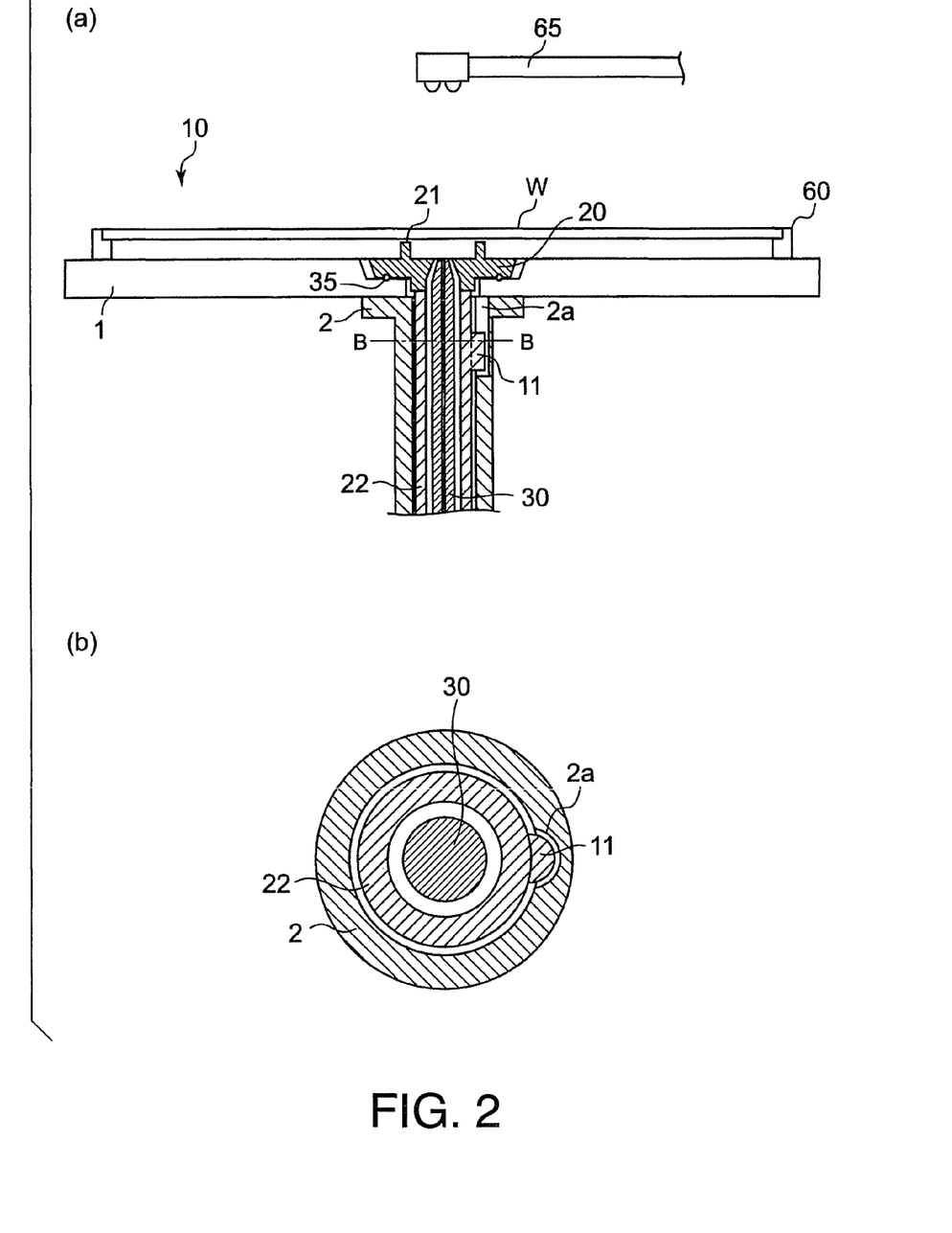
FIG. 2 is a lateral sectional view and a cross-sectional view showing the liquid processing apparatus in the first embodiment of the present invention.

As shown in FIGS. 1(a), 1(b), and 2(a), a liquid processing apparatus 10 includes: a hollow holding plate 1 configured to hold an object to be processed such as a semiconductor wafer W (hereinafter referred to also as "wafer"); a hollow outer rotational shaft 2 (see, FIG. 2(b)) fixedly connected to the holding plate 1; and a rotary drive part 3 configured to rotate the outer rotational shaft 2 in a predetermined rotational direction. As shown in FIG. 2(a), the holding plate 1 holds a wafer W by means of a holding member 60. FIG. 2(b) is a cross-sectional view taken along the line B-B of FIG. 2(a).

As shown in FIGS. 1(a) and 1(b), a bearing 31 is disposed on a position outward a periphery of the outer rotational shaft 2. The rotary drive part 3 includes a pulley 62 disposed on a position outward the periphery of the outer rotational shaft 2, and a motor 61 for imparting a driving force to the pulley 62 through a driving belt 63.

As shown in FIGS. 1(a), 1(b), and 2(a), disposed in the hollow space of the holding plate 1 are a lift pin plate 20 provided with a lift pin 21. In addition, in the hollow space of the outer rotational shaft 2, an inner rotational shaft 22 fixedly connected to the lift pin plate 20 is vertically extended.

As shown in FIGS. 1(a) and 1(b) and FIGS. 2(a) and 2(b), the inner rotational shaft 22 and the lift pin plate 20 have hollow shapes. Inside the inner rotational shaft 22 and the lift pin plate 20 (in the hollow spaces thereof), there is vertically extended a rear-side cleaning-liquid supply part (cleaning-liquid supply part) 30 configured to supply a cleaning liquid onto a rear surface of a wafer W held by the holding plate 1. As shown in FIGS. 1(a) and 1(b), the inner rotational shaft 22 is equipped with a lifting member 16 that raises and lowers the lift pin plate 20 and the inner rotational shaft 22 so as to locate them on an upper position and a lower position.

The lifting member 16 raises and lowers the inner rotational shaft 22 so as to raise and lower the lift pin plate 20. A bearing 32 is disposed on a position outward a periphery of the inner rotational shaft 22, whereby the inner rotational shaft 22 is capable of being rotated, which will be described below.

As shown in FIG. 2(a), disposed above the holding plate 1 is a front-side cleaning-liquid supply part 65 configured to supply a cleaning liquid onto a front surface of a wafer W held by the holding plate 1.

The cleaning liquid means a chemical liquid and a rinse liquid. As the chemical liquid, there may be used diluted hydrofluoric acid, ammonia peroxide mixture (SC1), and hydrochloric peroxide mixture (SC2). Meanwhile, a deionized water (DIW) may be used as the rinse liquid.

In addition, a gas for drying made of $N_2$ or the like can be supplied from the rear-side cleaning-liquid supply part 30, and a liquid for drying made of IPA (isopropyl alcohol) can be supplied from the front-side cleaning-liquid supply part 65.

When located on the lower position (see, FIG. 1(a)), the inner rotational shaft 22 is capable of being in contact with the outer rotational shaft 2 in the rotational direction of the outer rotational shaft 2. To be more specific, the inner rotational shaft 22 has an inside projection part 11 projecting outwardly from the margin thereof, while the outer rotational shaft 2 has an outside recess part 2a adapted to receive the inside projection part 11 (see, FIG. 2(b)). The inside projection part 11 receive in the outside recess part 2a can be in contact with the outer rotational shaft 2 in the rotational direction of the outer rotational shaft 2.

Thus, the lift pin plate 20 fixedly connected to the inner rotational shaft 22 can be rotated by a force imparted from the rotary drive part 3 for rotating the outer rotational shaft 2.

When the inner rotational shaft 22 is raised and lowered by the lifting member 16, the inside projection part 11 is guided in the outside recess part 2a (see, FIG. 1(b)).

In FIG. 2(b), the number of the inside projection part 11 and the number of the outside recess part 2a corresponding to the inside projection part 11 are respectively one. However, not limited thereto, the plurality of inside projection parts 11 and the outside recess parts 2a may be provided.

As shown in FIGS. 1(a), 1(b), and 2, a sealing member formed of an O-ring or the like is disposed between the lift pin plate 20 and the holding plate 1.

Next, an operation of this embodiment as structured above is described.

Figure 3:
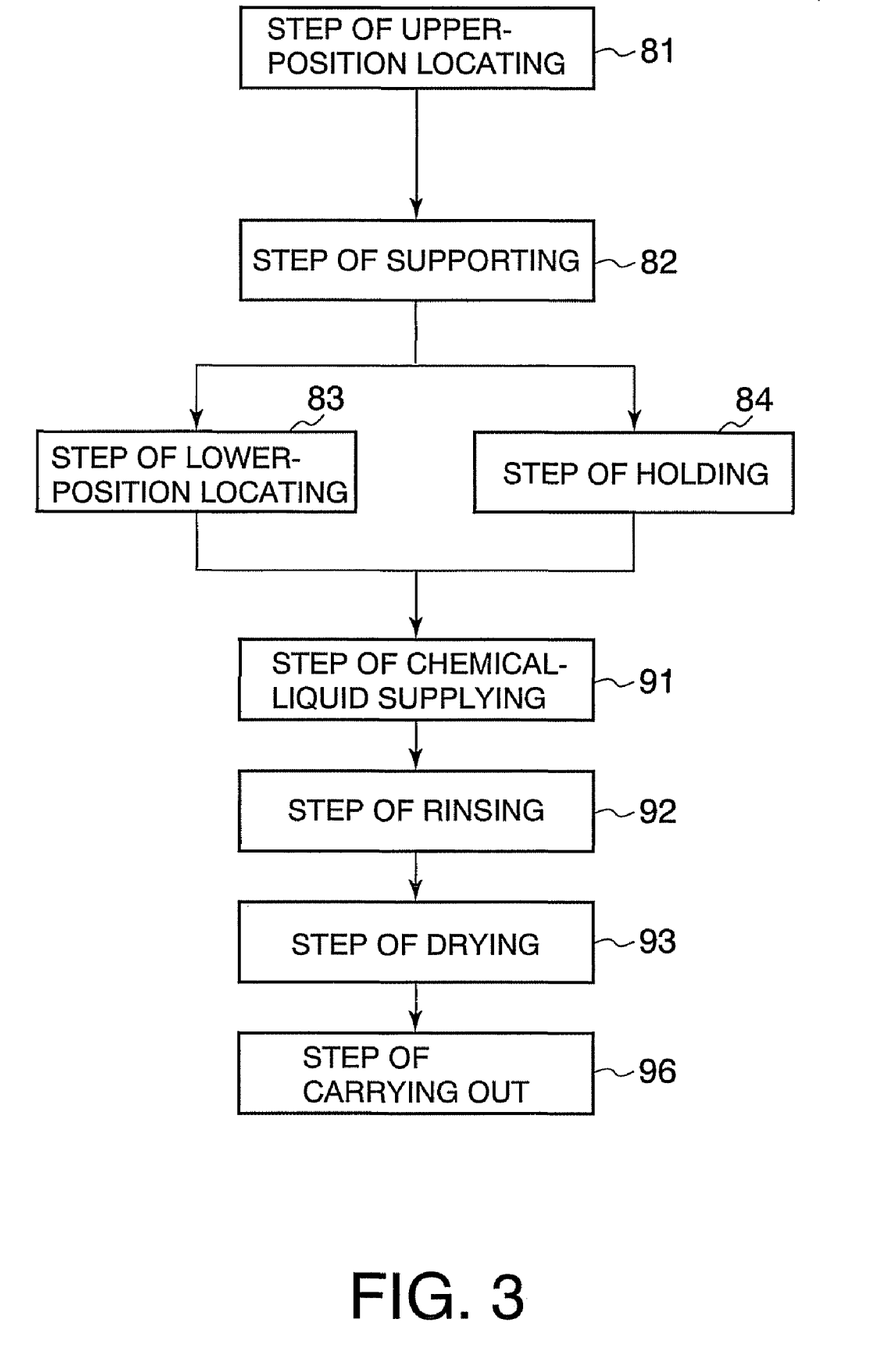
FIG. 3 is a flowchart showing a flow of a liquid processing method performed by the liquid processing apparatus in the first embodiment of the present invention.

At first, the lift pin plate 20 is located on the upper position (position to which the wafer transfer robot delivers a wafer W) by the lifting member 16 (step of upper-position locating 81) (see, FIG. 1(b) and FIG. 3). More specifically, the inner rotational shaft 22 is located on the upper position by the lifting member 16, so that the lift pin plate 20 fixedly connected to the inner rotational shaft 22 is located on the upper position.

Then, the wafer W is received by the lift pin 21 of the lift pin plate 20 from the wafer transfer robot (not shown), and the wafer W is supported by the lift pin 21 (step of supporting 82) (see, FIG. 1(b) and FIG. 3).

Then, the lift pin plate 21 is located on the lower position (position at which the wafer W is processed by a cleaning liquid) by the lifting member 16 (step of lower-position locating 83) (see, FIG. 1(a) and FIG. 3). More specifically, the inner rotational shaft 22 is located on the lower position by the lifting member 16, so that the lift pin plate 20 fixedly connected to the inner rotational shaft 22 is located on the lower position. At this time, the inside projection part 11 of the inner rotational shaft is received into the outside recess part 2a of the outer rotational shaft 2.

When the lift pin plate 20 is located on the lower position in this manner, the wafer W is held by the holding member 60 of the holding plate 1 (step of holding 84) (see, FIG. 2(a) and FIG. 3).

Then, the outer rotational shaft 2 is rotated by the rotary drive part 3, so that the wafer W held by the holding plate 1 is rotated (step of rotating) (see, FIG. 3). At this time, the inside projection part 11 received in the outside recess part 2a is capable of being in contact with the outer rotational shaft 2 in the rotational direction of the outer rotational shaft 2. Thus, when the outer rotational shaft 2 is rotated by the rotary drive part 3, the inner rotational shaft 22 can be rotated (see, FIG. 2(b)). Therefore, the lift pin plate 20 fixedly connected to the inner rotational shaft 22 can also be rotated.

While the wafer W held by the holding plate 1 and the lift pin plate 20 are being rotated in this manner, the following steps are performed.

At first, a chemical liquid is supplied to the wafer W by the front-side cleaning-liquid supply part 65 and the rear-side cleaning-liquid supply part 30 (step of chemical-liquid supplying 91) (see, FIG. 2(a) and FIG. 3). Namely, the chemical liquid is supplied to the front surface of the wafer W by the front-side cleaning-liquid supply part 65, and the chemical liquid is supplied to the rear surface of the wafer W by the rear-surface cleaning-liquid supply part 30.

Then, a rinse liquid is supplied to the wafer W by the front-side cleaning-liquid supply part 65 and the rear-side cleaning-liquid supply part 30 (step of rinsing 92) (see, FIG. 3). Namely, the rinse liquid is supplied to the front surface of the wafer W by the front-side cleaning-liquid supply part 65, and the rinse liquid is supplied to the rear surface of the wafer W by the rear-surface cleaning-liquid supply part 30.

During the performance of the step of chemical-liquid supplying 91 and the step of rinsing 92, the outer rotational shaft 2 is rotated by the rotary drive part 3, so that the inner rotational shaft 22 is rotated so that the lift pin plate 20 is rotated. Thus, the cleaning liquids such as the chemical liquid and the rinse liquid used for cleaning the wafer W can be prevented from pooling in the lift pin plate 20, and the cleaning liquids can be prevented from remaining on the lift pin 21.

That is to say, the cleaning liquids such as the chemical liquid and the rinse liquid received by the lift pin plate 20 are moved outward the periphery of the lift pin plate 20 by a centrifugal force generated by the rotation of the lift pin plate 20. Thus, since the cleaning liquids used for cleaning the wafer W are removed from the lift pin plate 20 and the lift pin 21 at any time, pooling of the cleaning liquids in the lift pin plate 20 and remaining of the cleaning liquids on the lift pin 21 can be prevented.

In this embodiment, a distance between a distal end of the lift pin 21 of the lift pin plate 20 and a lower surface of the wafer W held by the holding plate 1 is 5 mm or smaller, when the lift pin plate 20 is located on the lower position (see, FIG. 1(a) and FIG. 2(a)). Thus, the distal end of the lift pin 21 can be cleaned by the chemical liquid and the rinse liquid flowing along the lower surface of the wafer W.

As a result, in the above-described step of supporting 82 and the below-described step of carrying out 96 where the distal end of the lift pin 21 is brought into contact with the rear surface of the wafer W, contaminations adhering to the distal end of the lift pin 21 can be prevented from moving onto the rear surface of the wafer W.

After the step of rinsing 92 has been finished, a step of drying 93 is performed.

Namely, a liquid for drying made of IPA (isopropyl alcohol) or the like is supplied from the front-side cleaning-liquid supply part 65, and a gas for drying made of $N_2$ or the like is supplied from the rear-side cleaning-liquid supply part 30. Also at this time, the lift pin plate 20 is rotated by the driving force imparted from the rotary drive part 3.

Thus, the cleaning liquids (especially the rinse liquid) remaining on the lift pin plate 20 and the lift pin 21 are moved outward the periphery of the lift pin plate 20 by a centrifugal force generated by the rotation of the lift pin plate 20. Therefore, the cleaning liquids (especially the rinse liquid) can be reliably prevented from remaining on the lift pin plate 20 and the lift pin 21.

After the step of drying 93 is finished, the wafer W is raised by the lift pin 21 of the lift pin plate 20, and the wafer W is moved to the wafer transfer robot (step of carrying out 96) (see, FIG. 1(b) and FIG. 3). As described above, during the step of chemical-liquid supplying 91, the step of rinsing 92, and the step of drying 93, since the lift pin plate 20 is continuously rotated, no cleaning liquid remains on the lift pin plate 20 and the lift pin 21.

Therefore, when the wafer W is raised by the lift pin 21 of the lift pin plate 20, there is no possibility that liquid droplets of the cleaning liquid pooling in the lift pin plate 20 and the liquid droplets of the cleaning liquid remaining on the lift pin 21 adhere to the rear surface of the wafer W.

As a result, formation of watermarks on the wafer W itself to which the liquid droplets adhere can be prevented. In addition thereto, formation of watermarks on other wafers W contained in a carrier into which the wafer W has been brought can be prevented.

In this embodiment, as shown in FIGS. 1(a), 1(b) and FIG. 2(a), the sealing member 35 formed of an O-ring or the like is disposed between the lift pin plate 20 and the holding plate 1. Thus, in the aforementioned step of chemical-liquid supplying 91, the step of rinsing 92, and the step of drying 93, it can be prevented that the chemical liquid, the rinse liquid; and the liquid for drying enter the hollow space of the outer rotational shaft 2 from between the lift pin plate 20 and the holding plate 1.

That is to say, in the conventional apparatus, since the holding plate 1 can be rotated while the lift pin plate 2 is fixed, there exits a gap between the holding plate 1 and the lift pin plate 20. Thus, in order that the chemical liquid, the rinse liquid, and the liquid for drying are prevented from entering the hollow space of the outer rotational shaft 2 thorough this gap, it is necessary to jet a gas such as $N_2$ from the gap to the above (purging is necessary).

On the other hand, according to this embodiment, since the lift pin plate 20 can be rotated together with the holding plate 1, the holding plate 1 and the lift pin plate 20 can be brought into tight contact with each other. Therefore, owing to only disposing of the sealing member 35 between the holding plate 1 and the lift pin plate 20, the chemical liquid, the rinse liquid, and the liquid for drying can be prevented from entering the hollow space of the outer rotational shaft 2.

The above embodiment has been described by giving the example in which the inner rotational shaft 22 has the inside projection part 11 projecting outwardly from the margin thereof, and the outer rotational shaft 2 has the outside recess part 2a adapted to receive the inside projection part 11, whereby the inside projection part 11 received in the outside recess part 2a is capable of being in contact with the outer rotational shaft 2 in the rotational direction of the outer rotational shaft 2. However, not limited thereto, as shown in FIGS. 4 and 5, the outer rotational shaft 2 may have an outside projection part 12 projecting inwardly from the margin thereof, and an inner rotational shaft 23 may have an inside recess part 23a adapted to receive the outside projection part 12, whereby the outside projection part 12 received in the inside recess part 23a can be in contact with the inner rotational shaft 23 in the rotational direction of the outer rotational shaft 2.

Alternatively, the outer rotational shaft 2 may be provided with a spline nut of a ball spline, and a ball disposed in the spline nut may constitute the outside projection part 12. In this case, the inside recess part 23a is formed so as to guide the ball (see, FIG. 5). When the outer rotational shaft 2 is provided with the spline nut of the ball spline so that the outside projection part 12 is constituted by the ball, it is easy to raise and lower the inner rotational shaft 23 by the lifting member 16.

The above embodiment has been described by giving the example in which the lift pin 21 of the lift pin plate 20 is located in the vicinity of the center of the holding plate 1. However, not limited thereto, as shown in FIG. 6, the lift pin plate 20 may have a circular shape extending up to a position near to the periphery of the holding plate 1, and the lift pin 21 may be located on a position near to the periphery of the holding plate 1.

When the lift pin 21 is located on a position near to the periphery of the holding plate 1, the distal end of the lift pin 21 can be cleaned by the chemical liquid and the rinse liquid which have been used for cleaning the rear surface of the wafer W, while irregular flow of the cleaning liquid on the rear surface of the wafer W can be restrained.

In this embodiment, information relating to the respective steps of the above-described liquid processing method is stored in a storage medium 52 (see, FIGS. 1(a) and 1(b)). The liquid processing apparatus 10 includes a computer 55 acceptable to the storage medium 52, and a control part 50 configured to control the liquid processing apparatus 10 based on a signal from the computer 55. Thus, when the storage medium 52 is inserted to the computer 55, the control part 50 can cause the liquid processing apparatus 10 to perform the aforementioned series of liquid processing method (see, FIGS. 1(a) and 1(b)).

Second Embodiment

Next, a second embodiment of the present invention is described with reference to FIGS. 7(a) and 7(b). In the second embodiment shown in FIGS. 7(a) and 7(b), instead of an inner rotational shaft 22 located on a lower position being incapable of being in contact with an outer rotational shaft 2 in a rotational direction of the outer rotational shaft 2, a lift pin plate 20 in the lower position can be fixed with respect to a holding plate 1. Other structures are substantially the same as those of the first embodiment shown in FIGS. 1 to 6. In this embodiment, the below-described inner shaft 22' is a member corresponding to the inner rotational shaft 22 of the first embodiment. However, since the inner shaft 22' is not rotated which is different from the first embodiment, the member is referred to as the inner shaft 22'.

Figure 7:
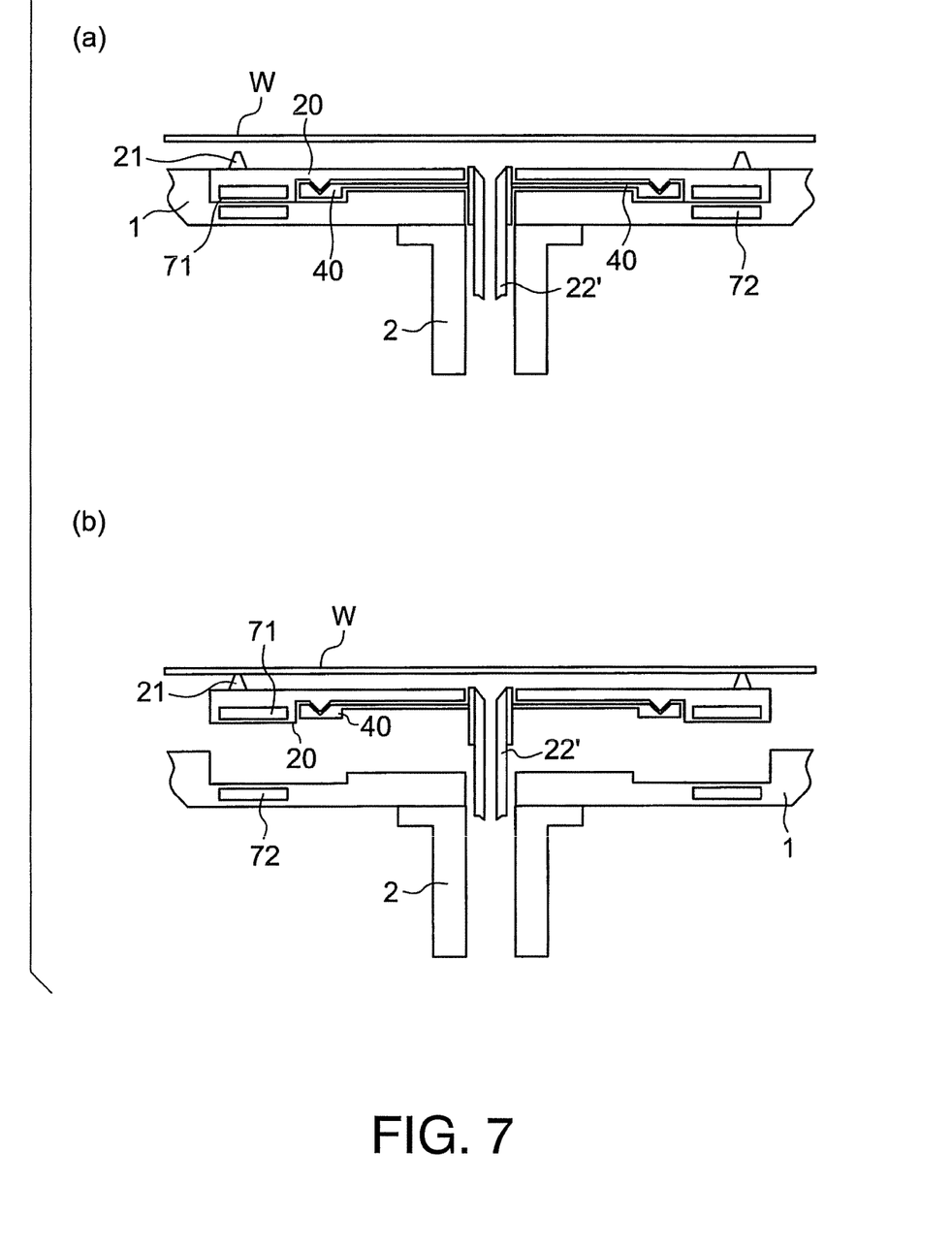
FIG. 7 is lateral side views showing a driving manner of the liquid processing apparatus in a second embodiment of the present invention.

In the second embodiment shown in FIGS. 7(a) and 7(b), the same parts as the parts of the first embodiment shown in FIGS. 1 to 6 are indicated by the same reference numbers, and detailed description thereof is omitted.

As shown in FIGS. 7(a) and 7(b), a first magnet 71 is disposed in the lift pin plate 20, and a second magnet 71 is disposed in the holding plate 1. When the lift pin plate 20 is located on the lower position, the first magnet 71 is fixed with respect to the second magnet 72, so that the lift pin plate 20 is fixed with respect to the holding plate 1.

As shown in FIGS. 7(a) and 7(b), disposed between the lift pin plate 20 and the holding plate 1 is a support member 40 configured to support the lift pin plate 20 from below when the lift pin plate 20 is raised and lowered. In FIGS. 7(a) and 7(b), a rear-side cleaning-liquid supply part 30 is omitted for simplifying the illustration.

The support member 40 is connected to the inner shaft 22', and is in contact with neither the holding plate 1 nor the lift pin plate 20 during the rotation of the holding plate 1. Thus, when an outer rotational shaft 2 is rotated by a rotary drive part 3, the inner shaft 22' is not rotated.

This embodiment can produce the similar effect to that of the first embodiment. The main effect is as follows.

Namely, during the performance of the step of 0chemical-liquid supplying 91 and the step of rinsing 92, the outer rotational shaft 2 is rotated by the rotary drive part 3, so that the holding plate 1 is rotated. In accordance with the rotation of the holding plate 1, the lift pin plate 20, which is fixed to the holding plate 1 by a magnetic force generated between the first magnet 71 and the second magnet 72, is rotated. Thus, since the cleaning liquids such as the chemical liquid and the rinse liquid used for cleaning the wafer W are removed from the lift pin plate 20 and the lift pin 20 at any time, pooling of the cleaning liquids in the lift pin plate 20 and remaining of the cleaning liquids on the lift pin 21 can be prevented.

Also in the step of drying 93, the lift pin plate 20 is rotated by the driving force imparted from the rotary drive part 3. Thus, the cleaning liquids (especially the rinse liquid) remaining on the lift pin plate 20 can be removed from the lift pin plate 20 by a centrifugal force generated by the rotation of the lift pin plate 20. As a result, pooling of the cleaning liquids (especially the rinse liquid) in the lift pin plate 20 and remaining of the cleaning liquids on the lift pin 21 can be more reliably prevented.

For these reasons, when the wafer W is raised by the lift pin 21 of the lift pin plate 20, there is no possibility that liquid droplets of the cleaning liquids pooling in the lift pin plate 20 and the liquid droplets of the cleaning liquids remaining on the lift pin 21 adhere to the rear surface of the wafer W. As a result, formation of watermarks on the wafer W itself to which the liquid droplets adhere can be prevented. In addition thereto, formation of watermarks on other wafers W contained in a carrier into which the wafer W has been brought can be prevented.

In this embodiment, both or either one of the first magnet 71 and the second magnet 72 may be constituted by an electromagnet. When both or either one of the first magnet 71 and the second magnet 72 are (is) constituted by an electromagnet, the fixed state and the free state of the lift pin plate 20 with respect to the holding plate 1 can be suitably switched.

That is to say, by supplying an electric current to the electromagnet constituting the first magnet 71 and/or the second magnet 72, the lift pin plate 20 can be fixed with respect to the holding plate 1. Meanwhile, by stopping the electric current flowing through the electromagnet constituting the first magnet 71 and/or the second magnet 72, the lift pin plate 20 can be freely moved with respect to the holding plate 1.

To be more specific, (suppose that the first magnet 71 and the second magnet 72 are respectively electromagnets), in order that the lift pin plate 20 is rotated by the driving force imparted from the rotary drive part 3, an electric current is supplied to the electromagnets constituting the first magnet 71 and the second magnet 72 so as to fix the lift pin plate 20 with respect to the holding plate 1. Meanwhile, in order that the lift pin plate 20 is raised with respect to the holding plate 1 by the lifting member 16, the electric current flowing through the electromagnets constituting the first magnet 71 and the second magnet 72 is stopped so as to freely move the lift pin plate 20 with respect to the holding plate 1.

Namely, when the lift pin plate 20 is raised with respect to the holding plate 1 by the lifting member 16, the lift pin plate 20 is allowed to freely move with respect to the holding plate 1. Thus, when the lift pin plate 20 is separated from the holding plate 1, an accidental movement of the lift pin plate 20 can be prevented.

Third Embodiment

Next, a third embodiment of the present invention is described with reference to FIGS. 8(a) and 8(b). In the third embodiment shown in FIGS. 8(a) and 8(b), instead of an inner rotational shaft 22 located on a lower position being in capable of being in contact with an outer rotational shaft 2 in the rotational direction of the outer rotational shaft 2, a lift in plate 20 in the lower position can be fixed with respect to a holding plate 1 in a non-contact manner in a rotational direction of an outer rotational shaft 2. Other structures are substantially the same as those of the first embodiment shown in FIGS. 1 to 6.

Figure 8:
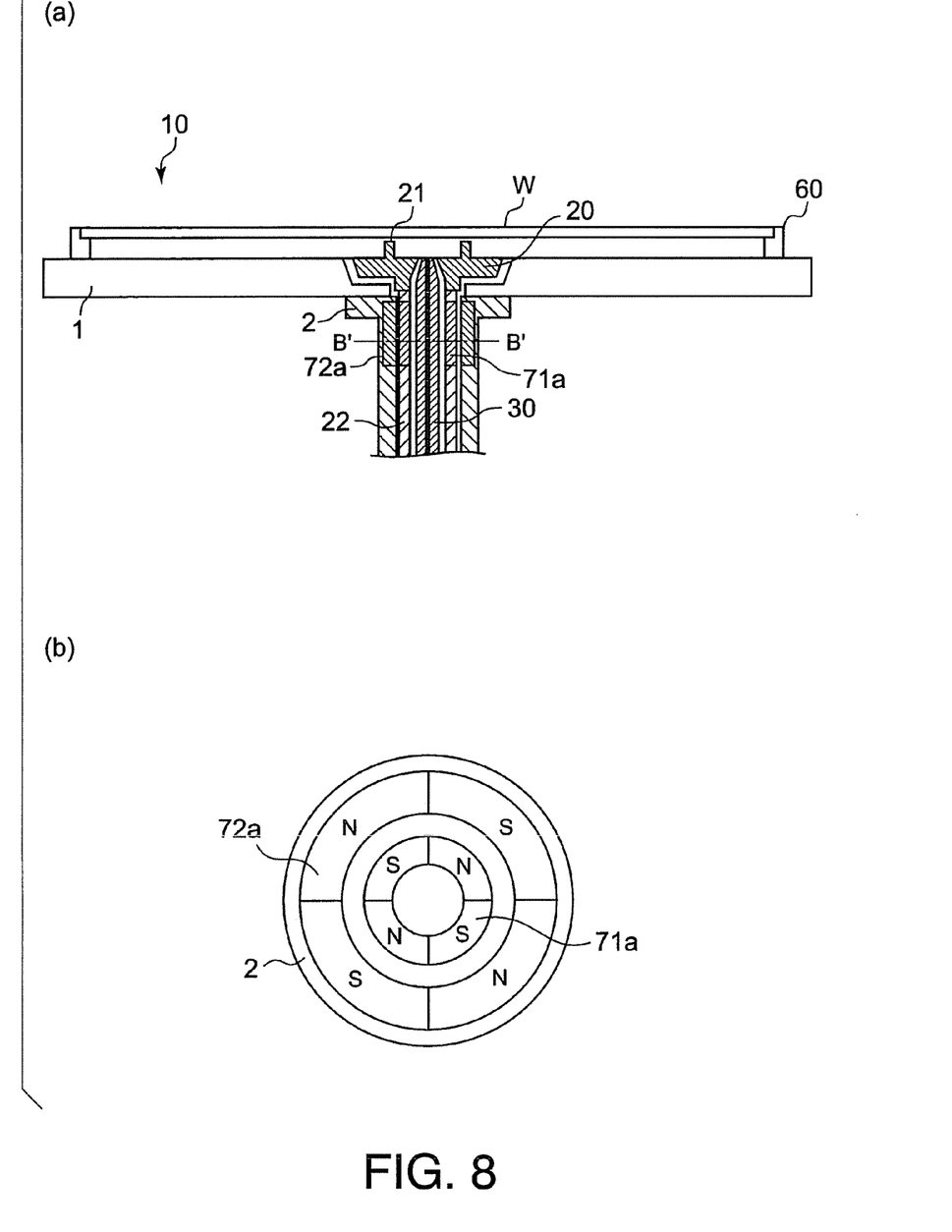
FIG. 8 is a lateral sectional view and a cross-sectional view showing the liquid processing apparatus in a third embodiment of the present invention.

In the third embodiment shown in FIGS. 8(a) and 8(b), the same parts as the parts of the first embodiment shown in FIGS. 1 to 6 and the second embodiment shown in FIGS. 7(a) and 7(b) are indicated by the same reference numbers, and detailed description thereof is omitted. FIG. 8(b) is a cross-sectional view taken along the line B'-B' of FIG. 8(a).

As shown in FIGS. 8(a) and 8(b), a first magnet 71a is disposed in an inner rotational shaft 22, and a second magnet 72a is disposed in the outer rotational shaft 2 at a position opposed to the first magnet 71a. Thus, when the lift pin plate 20 is located on the lower position, the outer rotational shaft 2 can be fixed with respect to the inner rotational shaft 22 in the rotational direction of the outer rotational shaft 2. As a result, when the outer rotational shaft 2 is rotated by a rotary drive part 3, the inner rotational shaft 22 and the lift pin plate 20 can be rotated.

In this embodiment, as shown in FIG. 8(b), each of the first magnet 71a and the second magnet 72a includes two N poles and two S poles. The N poles of the first magnet 71a are located in opposition to the S poles of the second magnet 72a, and the S poles of the first magnet 71a are located in opposition to the N poles of the second magnet 72a.

The embodiment as structured above can produce the effect similar to that of the first embodiment.

Fourth Embodiment

Next, a fourth embodiment of the present invention is described with reference to FIG. 9. In the fourth embodiment shown in FIG. 9, instead of an inner rotational shaft 22 located on a lower position being in capable of being in contact with an outer rotational shaft 2 in the rotational direction of the outer rotational shaft 2, a lift pin plate 20 in the lower position can be fixed with respect to a holding plate 1 in a rotational direction of an outer rotational shaft 2. Other structures are substantially the same as those of the first embodiment shown in FIGS. 1 to 6.

Figure 9:
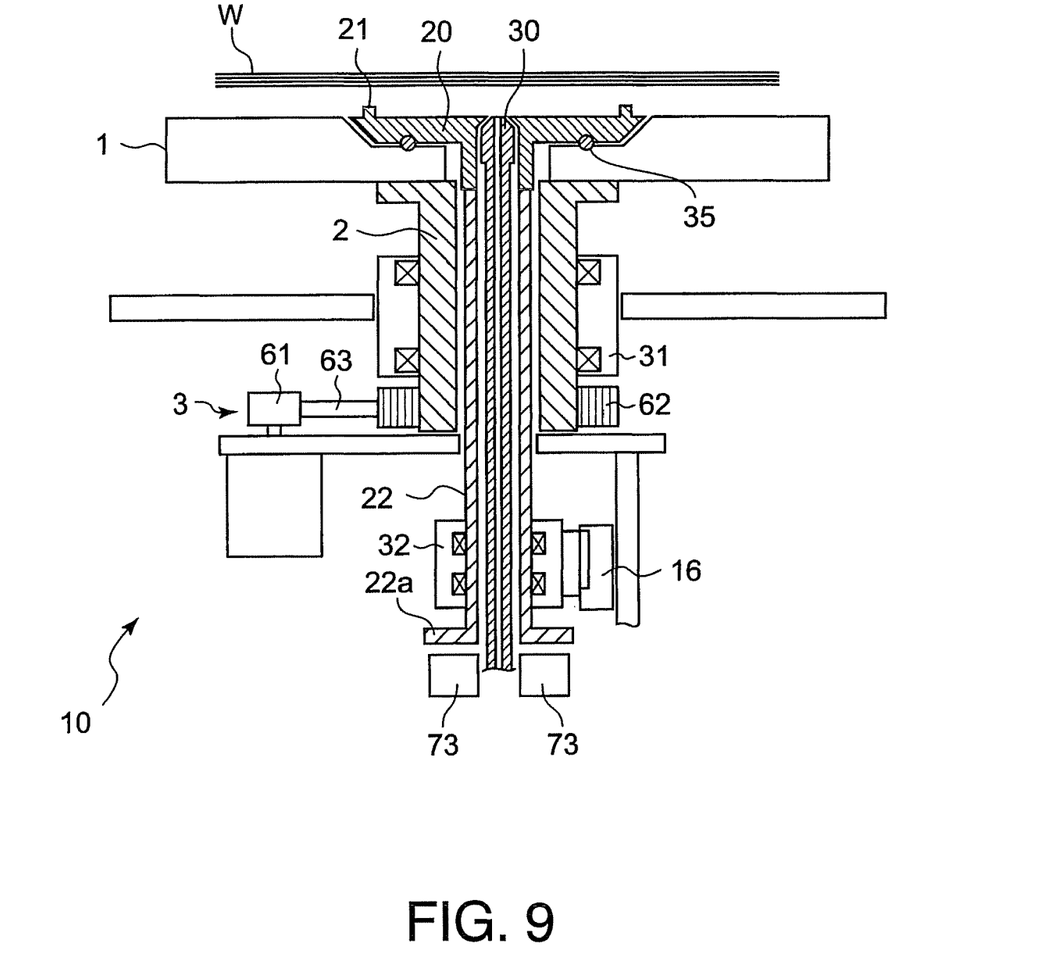
FIG. 9 is a lateral sectional view showing the liquid processing apparatus in a fourth embodiment of the present invention.

In the fourth embodiment shown in FIG. 9, the same parts as the parts of the first embodiment shown in FIGS. 1 to 6, the second embodiment shown in FIGS. 7(a) and 7(b), and the third embodiment shown in FIGS. 8(a) and 8(b) are indicated by the same reference numbers, and detailed description thereof is omitted.

As shown in FIG. 9, at a lower end of an inner rotational shaft 22, the inner rotational shaft 22 has a horizontally extending part (metal part) 22a made of a metal material.

As shown in FIG. 9, below the horizontally extending part 22a, there is provided a magnet 73 that imparts a magnetic force to the horizontally extending part 22a made of a metal material so as to draw the inner rotational shaft 22 downward. Thus, according to this embodiment, a large frictional force can be generated between the lift pin plate 20 and the holding plate 1 by an own weight of the lift pin plate 20 and the magnetic force imparted to the horizontally extending part 22a. As a result, when the lift pin plate 20 is located on the lower position, the lift pin plate 20 can be fixed with respect to the holding plate 1 in the rotational direction of the outer rotational shaft. 2. Therefore, when the outer rotational shaft 2 is rotated by a rotary drive part 3, the lift pin plate 20 can be rotated.

The embodiment as structured above can produce the effect similar to that of the first embodiment.

In this embodiment, the magnet 73 may be constituted by an electromagnet. When the magnet 73 is constituted by an electromagnet, the fixed state and the free state of the lift pin plate 20 with respect to the holding plate 1 can be suitably switched.

The invention claimed is:

1. A liquid processing apparatus comprising:
   a hollow holding plate configured to hold an object to be processed;
   a hollow outer rotational shaft fixedly connected to the holding plate;
   a rotary drive part configured to rotate the outer rotational shaft in a predetermined rotational direction;
   a lift pin plate disposed in a hollow space of the holding plate, and having a lift pin configured to support the object to be processed;
   a cleaning-liquid supply part disposed inside the holding plate, the cleaning-liquid supply part being configured to supply a cleaning liquid to the object to be processed held by the holding plate; and
   a lifting member configured to raise and lower the lift pin plate so as to locate the lift pin plate on an upper position and a lower position;
   wherein, when the lift pin plate is located on the lower position, the lift pin plate is rotated by receiving a force imparted from the rotary drive part for rotating the outer rotational shaft.

2. The liquid processing apparatus according to claim 1 further comprising an inner rotational shaft extending in a hollow space of the outer rotational shaft and fixedly connected to the lift pin plate, wherein
   the inner rotational shaft is located on the upper position and the lower position by the lifting member, and when the inner rotational shaft is located on the lower position, the inner rotational shaft is capable of being in contact with the outer rotational shaft in the rotational direction of the outer rotational shaft.

3. The liquid processing apparatus according to claim 2, wherein:
   the inner rotational shaft has an inside projection part projecting outwardly from a margin of the inner rotational shaft;
   the outer rotational shaft has an outside recess part adapted to receive the inside projection part; and
   the inside projection part received in the outside recess part is capable of being in contact with the outer rotational shaft in the rotational direction of the outer rotational shaft.

4. The liquid processing apparatus according to claim 2, wherein:
   the outer rotational shaft has an outside projection part projecting inwardly from a margin of the outer rotational shaft;
   the inner rotational shaft has an inside recess part adapted to receive the outside projection part; and the outside projection part received in the inside recess part is capable of being in contact with the inner rotational shaft in the rotational direction of the outer rotational shaft.

5. The liquid processing apparatus according to claim 1, wherein
when the lift pin plate is located on the lower position, the lift pin plate is capable of being fixed with respect to the holding plate.

6. The liquid processing apparatus according to claim 5, wherein:
a first magnet is disposed in the lift pin plate;
a second magnet is disposed in the holding plate; and
when the lift pin plate is located on the lower position, the first magnet is fixed with respect to the second magnet, so that the lift pin plate is capable of being fixed with respect to the holding plate.

7. The liquid processing apparatus according to claim 1, wherein:
a first magnet is disposed in an inner rotational shaft;
a second magnet is disposed in the outer rotational shaft at a position opposed to the first magnet; and
when the lift pin plate is located on the lower position, the first magnet is fixed with respect to the second magnet in a non-contact manner.

8. The liquid processing apparatus according to claim 5, wherein:
at least a part of an inner rotational shaft has a metal part made of a metal;
there is provided a magnet configured to impart a magnetic force to the metal part so as to draw the inner rotational shaft downward; and
when the lift pin plate is located on the lower position, the lift pin plate is capable of being fixed with respect to the holding plate in the rotational direction of the outer rotational shaft by an own weight of the lift pin plate and the magnetic force imparted to the metal part.

9. The liquid processing apparatus according to claim 6, wherein
the magnet is an electromagnet.

10. A liquid processing method performed with the use of a liquid processing apparatus including: a hollow holding plate; a hollow outer rotational shaft fixedly connected to the holding plate; a rotary drive part configured to rotate the outer rotational shaft in a predetermined rotational direction; a lift pin plate disposed in a hollow space of the holding plate and having a lift pin; a cleaning-liquid supply part disposed inside the holding plate; and a lifting member configured to raise and lower the lift pin plate so as to locate the lift pin plate on an upper position and a lower position; the liquid processing method comprising the steps of:
an upper-position locating in which the lift pin plate is located on the upper position by the lifting member;
a supporting in which an object to be processed is supported by the lift pin of the lift pin plate;
a lower-position locating in which the lift pin plate is located on the lower position by the lifting member;
a holding in which the object to be processed is held by the holding plate;
a rotating in which the outer rotational shaft is rotated by the rotary drive part, so that the object to be processed held by the holding plate is rotated;
a chemical-liquid supplying in which a chemical liquid is supplied to the object to be processed by the cleaning-liquid supply part; and
a rinsing in which a rinse liquid is supplied to the object to be processed by the cleaning-liquid supply part;
wherein the lift pin plate located on the lower position is rotated by a force imparted from the rotary drive part for rotating the outer rotational shaft.

11. A storage medium storing a computer program for causing a computer to implement a liquid processing method, the liquid processing method performed with the use of a liquid processing apparatus including: a hollow holding plate; a hollow outer rotational shaft fixedly connected to the holding plate; a rotary drive part configured to rotate the outer rotational shaft in a predetermined rotational direction; a lift pin plate disposed in a hollow space of the holding plate and having a lift pin; a cleaning-liquid supply part disposed inside the holding plate; and a lifting member configured to raise and lower the lift pin plate so as to locate the lift pin plate on an upper position and a lower position; the liquid processing method comprising the steps of:
an upper-position locating in which the lift pin plate is located on the upper position by the lifting member;
a supporting in which an object to be processed is supported by the lift pin of the lift pin plate;
a lower-position locating in which the lift pin plate is located on the lower position by the lifting member;
a holding in which the object to be processed is held by the holding plate;
a rotating in which the outer rotational shaft is rotated by the rotary drive part, so that the object to be processed held by the holding plate is rotated;
a chemical-liquid supplying in which a chemical liquid is supplied to the object to be processed by the cleaning-liquid supply part; and
a rinsing in which a rinse liquid is supplied to the object to be processed by the cleaning-liquid supply part;
wherein the lift pin plate located on the lower position is rotated by a force imparted from the rotary drive part for rotating the outer rotational shaft.

12. The liquid processing apparatus according to claim 7, wherein the magnet is an electromagnet.

13. The liquid processing apparatus according to claim 8, wherein the magnet is an electromagnet.

* * * * *